(12) United States Patent
Uchida et al.

(10) Patent No.: US 7,669,104 B2
(45) Date of Patent: Feb. 23, 2010

(54) FORWARD ERROR CORRECTION METHOD AND COMMUNICATION METHOD, AND FORWARD ERROR CORRECTION CODE ADDITION APPARATUS AND COMMUNICATION APPARATUS

(75) Inventors: Isao Uchida, Tokyo (JP); Akira Nagashima, Tokyo (JP); Akira Miura, Tokyo (JP); Chie Sato, Tokyo (JP)

(73) Assignee: Yokogawa Electric Corporation, Tokyo (JP)

( * ) Notice: Subject to any disclaimer, the term of this patent is extended or adjusted under 35 U.S.C. 154(b) by 484 days.

(21) Appl. No.: 11/218,440

(22) Filed: Sep. 6, 2005

(65) Prior Publication Data
US 2006/0053362 A1 Mar. 9, 2006

(30) Foreign Application Priority Data
Sep. 6, 2007 (JP) .................... P. 2004-258127

(51) Int. Cl.
*H03M 13/29* (2006.01)
(52) U.S. Cl. ...................... 714/755; 714/774
(58) Field of Classification Search ............. 714/755, 714/774
See application file for complete search history.

(56) References Cited
U.S. PATENT DOCUMENTS
5,699,369 A * 12/1997 Guha ..................... 714/774
6,499,128 B1 * 12/2002 Gerlach et al. ............ 714/755
6,718,508 B2 * 4/2004 Lodge et al. .............. 714/780
6,851,084 B2 * 2/2005 Pattavina .................. 714/776

FOREIGN PATENT DOCUMENTS
JP 5-265787 A 10/1993
JP 11-68659 A 3/1999

OTHER PUBLICATIONS
Japanese Office Action dated Apr. 2, 2009.
* cited by examiner

*Primary Examiner*—Stephen M Baker
(74) *Attorney, Agent, or Firm*—Sughrue Mion, PLLC

(57) ABSTRACT

In a forward error correction method and a forward error correction addition apparatus, error correction is performed on the basis of data, to which forward error correction code is added, transmitted through a network to output decoded data. The data transmitted through the network includes information bits represented by an information bit matrix with n rows and m columns (n, m are natural numbers), and redundancy bits represented by an odd number of redundancy information bit rows and an odd number of redundancy information bit columns based on the information bit matrix, which are provided in the row direction and in the column direction of the information bit matrix respectively. The redundancy bits are the forward error correction code.

1 Claim, 6 Drawing Sheets

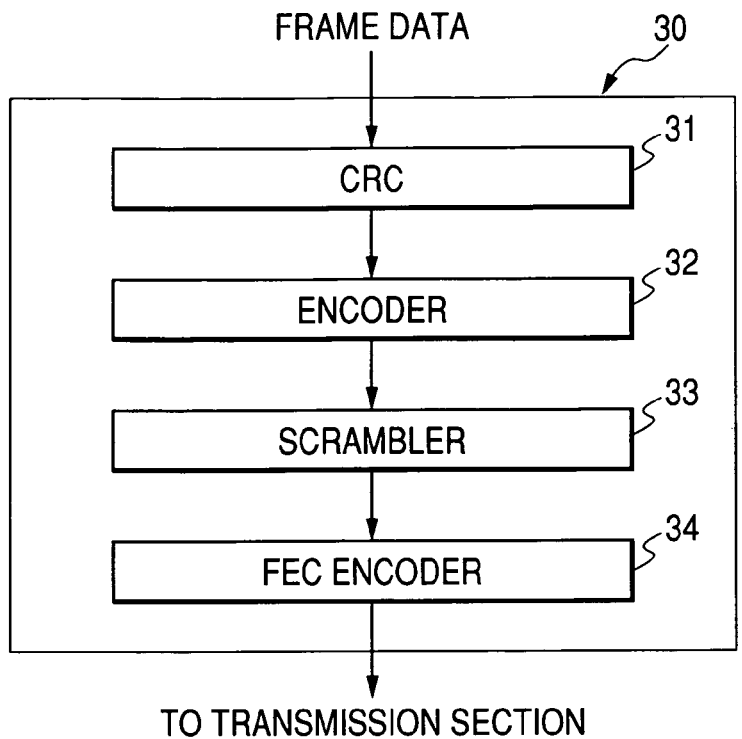
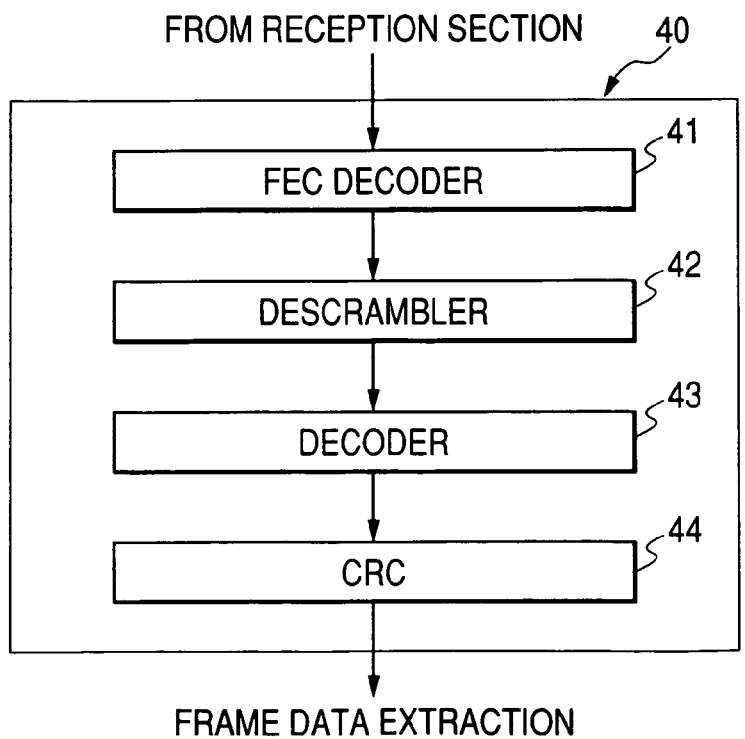

FORWARD ERROR CORRECTION METHOD AND COMMUNICATION METHOD, AND FORWARD ERROR CORRECTION CODE ADDITION APPARATUS AND COMMUNICATION APPARATUS

CROSS-REFERENCE TO RELATED APPLICATIONS

This application is based upon and claims the benefit of priority from the prior Japanese Patent Applications No. 2004-258127, filed on Sep. 6, 2004, the entire contents of which are incorporated herein by reference.

BACKGROUND OF THE INVENTION

1. Field of the Invention

The invention relates to a forward error correction method and a communication method, and a forward error correction addition apparatus and a communication apparatus. The invention particularly relates to those method and those apparatus using FEC (forward error correction) which is particularly effective for optical packet communications to maintain high-level communication quality using the EEC.

2. Description of the Related Art

JP-A-11-68659 discloses the configuration using the FEC to enhance the communication reliability of optical interconnection.

JP-A-11-68659 is referred to as a related art.

Optical fibers are used in a large number of places, such as not only the main network of various communication systems including a submarine cable system, but also communication channels in home data communication services (FTTH: Fiber To The Home) and trunk and branch lines of in-house LAN (Local Area Network) as communication channels capable of providing a high-speed and high-quality communication network.

Generally, it has been considered that noise little exists and "error control" for detecting and correcting an information error occurring in a communication channel is not required in a communication system using the optical fibers.

In recent years, however, an "error" that information is not correctly transmitted to a receiver has occurred at a non-negligible level even in the communication system using the optical fibers with the long distance and large capacity of the network.

To transmit large-capacity information at a long distance without any error as much as possible, it is necessary to limit the relay distance of each optical communication apparatus, use a large number of optical communication apparatus, and use high-performance optical fiber transmission lines and optical communication apparatus; however, the investment costs are increased.

Then, to suppress the investment costs of the facilities, "error control method" for detecting and correcting an information error occurring in a communication channel as described above becomes important. Such error control methods in the communication system are roughly classified into FEC and ARQ (Automatic Repeat Request).

The FEC is a method of correcting an error at the receiving party using an error correction code with appropriate redundancy added to the information to be transmitted and outputting decode data as it is. The FEC has the advantages that it does not require a feedback communication channel, that system control is simple, that the delay is small, etc., but has the disadvantages in that it is difficult to handle a very long burst error, that the redundancy is large, that a decoder becomes complicated, etc.

On the other hand, the ARQ is a method of using an error detection code with appropriate redundancy added to the information to be transmitted (error correction code can also be used as error detection code) and requesting the transmitting party to resend the same data if an error is detected at the receiving party. The ARQ has the advantages that it has high reliability and is also resistant to an unforeseen error, that a decoder is simple, etc., but has the disadvantages in that it requires a feedback communication channel, that the delay may become large, that congestion is caused by repeating resending in the communication channel at a high error rate, etc.

To adopt which error control, the type of occurring error, the error correction capability, the band enlargement ratio, the apparatus scale, the operation speed, the delay time, and the like are considered.

Since the decoder of the error correction code used with the FEC is complicated as compared with the decoder of the error detection code used with the ARQ, it was considered that applying the FEC to a communication system is behind the ARQ; however, it also has become easy to implement an error correction decoder with the progression of the IC/LSI technology in recent years. Then, recently, it has become a common practice to first applying the FEC to a communication system for decreasing the error rate and then use the ARQ together if a high degree of reliability is required. A hybrid system using both the FEC and the ARQ in combination is also proposed.

By the way, the communication system using Ethernet (registered trademark) is a packet communication system which becomes most prevalent at present; particularly, it is widely used as the standard communication system in LAN. In error control in the communication system using Ethernet (registered trademark), generally error detection is only made and the Ethernet frame where an error is detected is discarded and the reliability of communications is not guaranteed. In fact, however, the reliability of communications is guaranteed because the ARQ is adopted for the protocol of TCP, etc., used with an upper layer of Ethernet (registered trademark).

The ARQ executed in the TCP is called "positive acknowledgement with retransmission." In this system, the receiving party communicates with the transmitting party and is requested to return an acknowledgment (ACK) message to the transmitting party upon reception of data. When sending a packet, the transmitting party starts a timer and if the timer times out before acknowledgment (ACK) arrives, the transmitting party retransmits the packet.

FIG. 5 is a drawing to show a configuration example of an error correction code addition section 10 in an optical packet transmission section in a related art. FIG. 6 is a drawing to show a configuration example of an error correction code detection section 20 in an optical packet reception section in the related art.

In FIG. 5, an error detection code is added to frame data made up of a header and a payload by a cyclic redundancy check (CRC) 11. The data is encoded by an encoder 12 and is scrambled by a scrambler 13 and then is output to a transmission section of a memory controller, etc.

On the other hand, in FIG. 6, the data received in a buffer, etc., is descrambled by a descrambler 21 and is decoded by a decoder 22. Error detection is made by a cyclic redundancy check 23 and the header and the payload of the optical packet are reproduced.

FIG. 7 is a schematic representation to describe the operation of positive acknowledgment in a communication system in a related art. In FIG. 7, events in a transmission site are shown to the left and events in a reception site are shown to the right. Each slanting line crossing the center indicates transfer of one message through a network.

(1) The transmission site transmits a packet 1 and
(2) starts a timer.
(3) Upon reception of the packet 1, the reception site
(4) transmits acknowledgement ACK1.
(5) Upon reception of the acknowledgement ACK1, the transmission site
(6) cancels the timer started with transmission of the packet 1.
(7) Subsequently, the transmission site transmits a packet 2 and
(8) starts the timer.
(9) Upon reception of the packet 2, the reception site
(10) transmits acknowledgement ACK2.
(11) Upon reception of the acknowledgement ACK2, the transmission site
(12) cancels the timer started with transmission of the packet 2.

FIG. 8 is a schematic representation to describe the operation when a packet loss occurs in a communication system similar to that in FIG. 7.

(1) The transmission site transmits a packet 1 and
(2) starts a timer. However, a packet loss occurs by the time the packet is received in the reception site.
(3) In the reception site, the packet 1 cannot be received although the time at which the packet 1 should be received is reached, and
(4) acknowledgement ACK1 cannot be transmitted although the time at which the acknowledgement ACK1 should be transmitted is reached.
(5) In the transmission site, the acknowledgement ACK1 cannot be received although the time at which the acknowledgement ACK1 should be received is reached, and
(6) the timer started with transmission of the packet 1 times out.
(7) Then, the transmission site retransmits the packet 1 and
(8) starts the timer.
(9) Upon reception of the packet 1, the reception site
(10) transmits acknowledgement ACK1.
(11) Upon reception of the acknowledgement ACK1, the transmission site
(12) cancels the timer started with transmission of the packet 1.

In the packet communication system in the related art, the FEC system is also adopted if large-capacity information is transmitted at a long distance and a very high degree of reliability is required; a Read-Solomon (RS) coding system is a representative. It is applied to the packet communication system by coding information in packet units.

However, the RS coding system has the disadvantages in that the flexibility of the length balance between information bits of information to be coded and redundancy bits of information added for error correction is low and that the RS coding system can be used only with limited packet, communications and the most of the available band cannot be made.

A system of coding information in units of length shorter than the packet length, such as word units can also be applied to packet communications as disclosed in JP-A-11-68659, for example.

However, in the system disclosed in JP-A-11-68659, the number of redundancy bits added to information bits is very small (short length) up to three or so relative to a word, the coding unit. Therefore, in the system disclosed in JP-A-11-68659, the flexibility of the length balance between information bits and redundancy bits is low. Further, the most of the available band cannot be made although the system can be used with a large number of types of packet communication systems because information is coded in word units.

SUMMARY OF THE INVENTION

An object of the invention is to provide a forward error correction method and a forward error correction addition apparatus in which the information bit length and the redundancy bit length can be set with high flexibility in combination, and further the degree of reliability of information subjected to error correction can be set as desired in each combination. Another object of the invention is to provide a communication method using the forward error correction method and a communication apparatus including the forward error correction addition apparatus, which can be used for packet communications.

The invention provides a forward error. Correction method of performing error correction based on data, to which forward error correction code is added, transmitted through a network to output decoded data, wherein the data transmitted through the network includes information bits represented by an information bit matrix with n rows and m columns (n, m are natural numbers), and redundancy bits represented by an odd number of redundancy information bit rows and an odd number of redundancy information bit columns based on the information bit matrix, which are provided in the row direction and in the column direction of the information bit matrix respectively, and the redundancy bits are the forward error correction code.

The invention also provides a communication method, having the steps of: transmitting packets that includes data to which forward error correction code is added; receiving the packets through a network; and performing error correction based on data included in the received packets, wherein the data transmitted through the network includes information bits represented by an information bit matrix with n rows and m columns (n, m are natural numbers), and redundancy bits represented by an odd number of redundancy information bit rows and an odd number of redundancy information bit columns based on the information bit matrix, which are provided in the row direction and in the column direction of the information bit matrix respectively, and the redundancy bits are the forward error correction code.

In the communication method, the packets are optical packets.

The invention also provides a forward error correction code addition apparatus, having: an FEC encoder which adds information bits represented by an information bit matrix with n rows and m columns (n, m are natural numbers) to forward error correction code represented by an odd number of redundancy information bit rows and an odd number of redundancy information bit columns based on the information bit matrix, which are provided in the row direction and in the column direction of the information bit matrix respectively.

The invention also provides a communication apparatus, having: an FEC encoder which adds information bits represented by an information bit matrix with n rows and m columns (n, m are natural numbers) to forward error correction code represented by an odd number of redundancy information bit rows and an odd number of redundancy information bit columns based on the information bit matrix, which are provided in the row direction and in the column direction of the information bit matrix respectively; a packet transmitting section which transmits packets including data in which the forward error correction code is added to the information bits; a packet receiving section which receives the packets; and an FEC decoder which performs error correction based on data included in the packets received by the packet receiving section.

In the communication apparatus, the packets are optical packets.

In the communication apparatus, the FEC decoder enables to set a degree of reliability of information subjected to error correction as desired.

According to the above method and the above apparatuses, the high-reliability and economical communication system making the most of the communication band width can be provided even in a communication environment with large noise effect. Further, the costs of service, maintenance, etc., for the communication system can be reduced.

BRIEF DESCRIPTION OF THE DRAWINGS

FIG. 1 is a drawing to show a configuration example of an error correction code addition section in an optical packet transmission section according to the invention;

FIG. 2 is a drawing to show a configuration example of an error correction code detection section in an optical packet reception section according to the invention;

DETAILED DESCRIPTION OF THE PREFERRED EMBODIMENTS

Figure 3:
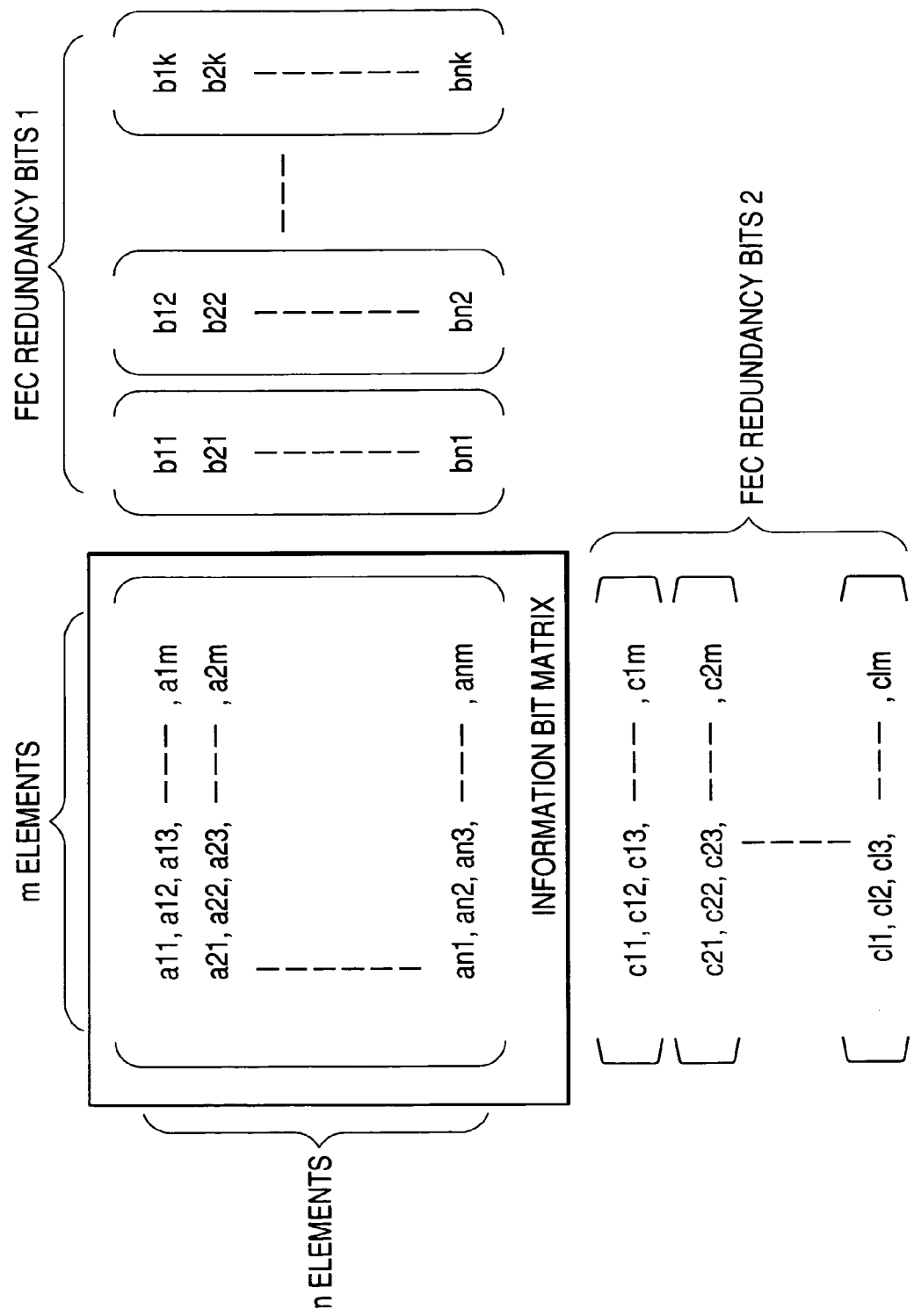
FIG. 3 is a schematic representation of forward error correction code according to the invention.

An embodiment of the invention will be discussed in detail with the accompanying drawings. FIG. 1 is a drawing to show a configuration example of an error correction code addition section 30 in an optical packet transmission section according to the invention. FIG. 2 is a drawing to show a configuration example of an error correction code detection section 40 in an optical packet reception section according to the invention.

In FIG. 1, an error detection code is added to frame data made up of a header and a payload by a cyclic redundancy check (CRC) 31. The data is encoded by an encoder 32 and is scrambled by a scrambler 33 and then an FEC code is added to the data by an FEC encoder 34 and the data is output to a transmission section including a memory controller, etc.

In FIG. 2, the data received and stored in a buffer, etc., is subjected to error correction processing by an FEC decoder 41 and then is descrambled by a descrambler 42 and further is decoded by a decoder 43. Error detection is made by a cyclic redundancy check 44 and the header and the payload of the optical packet are reproduced.

The operation of the FEC encoder 34 of the error correction code addition section 30 will be discussed in detail. Assume that the length of scrambled frame data (information bits) is FRM [bits]. If the number of the information bits is resolved into factors of appropriate natural numbers n and m, $$FRM = n*m$$

FIG. 3 shows this state. The matrix of the information bits shown in FIG. 3 is called information bit matrix. It is advisable to set n and m to close values as much as possible. If the number of the information bits cannot appropriately be factorized, data of an appropriate length is added to the original frame data. Although the value of t the data to be added may be any, it is desirable that it should be a value considering coding and scramble, such as '1010 . . . '

Next, the information bit matrix is used to find information bits bij and cij for redundancy bits represented by the following expressions:

$$bij = sum\ (a11, \ldots alm)\ mod\ 2;$$

where i=1, . . . , n; j=1, . . . , k;
k is an odd number; k<m $$cij = sum\ (a11, \ldots an1)\ mod\ 2;$$

where i=1, . . . , l; j=1, . . . , m;
l is an odd number; l<n

The information bits bij and cij for redundancy bits are coded and scrambled to generate redundancy bits. For example, such processing of suffixing the redundancy bits thus generated to the information bits to generate a code data is performed.

Next, the operation of the FEC decoder 41 of the error correction code detection section 40 will be discussed. Predetermined n, m, k, l (constant) information is used to resolve the code data into information bits and redundancy bits. Since the redundancy bits are coded and scrambled, they are descrambled and decoded k and l are values that can be set as desired if they are odd numbers smaller than m and n respectively.

Figure 4:
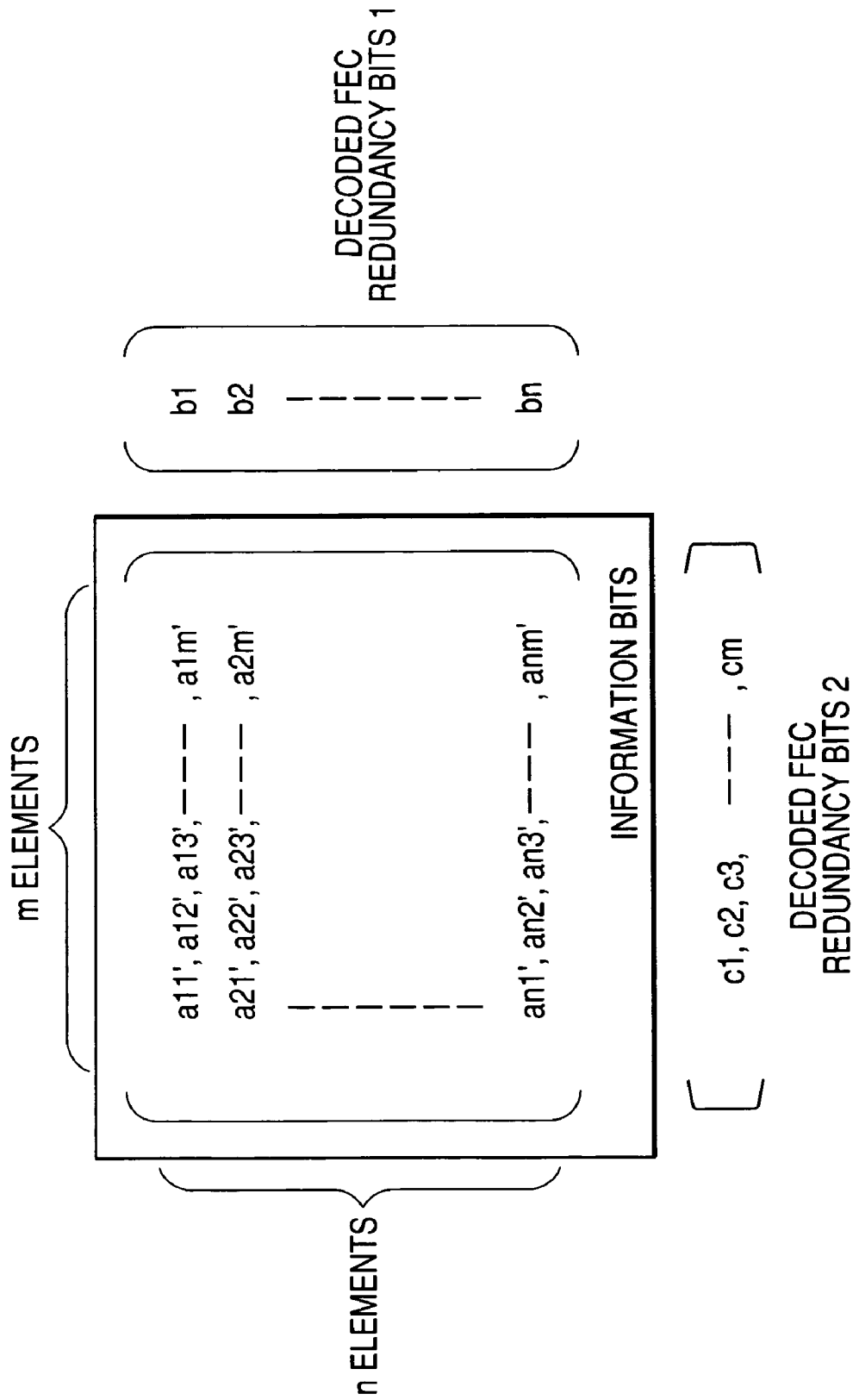
FIG. 4 is a schematic representation of error correction vectors according to the invention.
Figure 5:
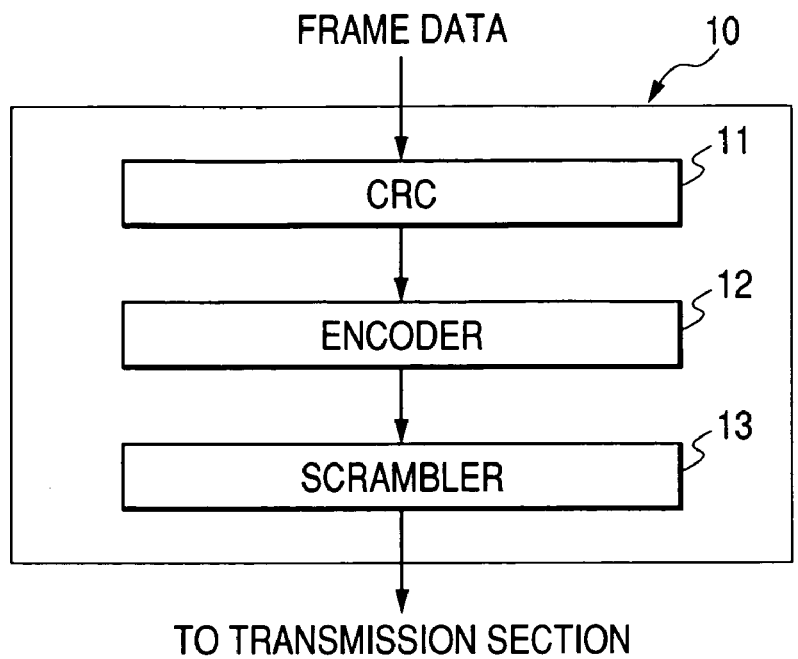
FIG. 5 is a drawing to show a configuration example of an error correction code addition section in an optical packet transmission section in a related art.
Figure 6:
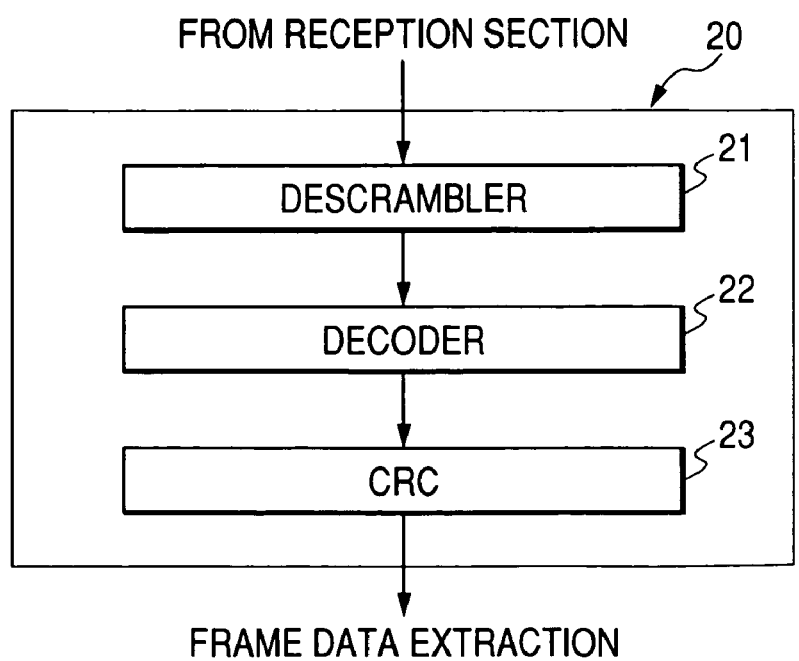
FIG. 6 is a drawing to show a configuration example of an error correction code detection section in an optical packet reception section in the related art.
Figure 7:
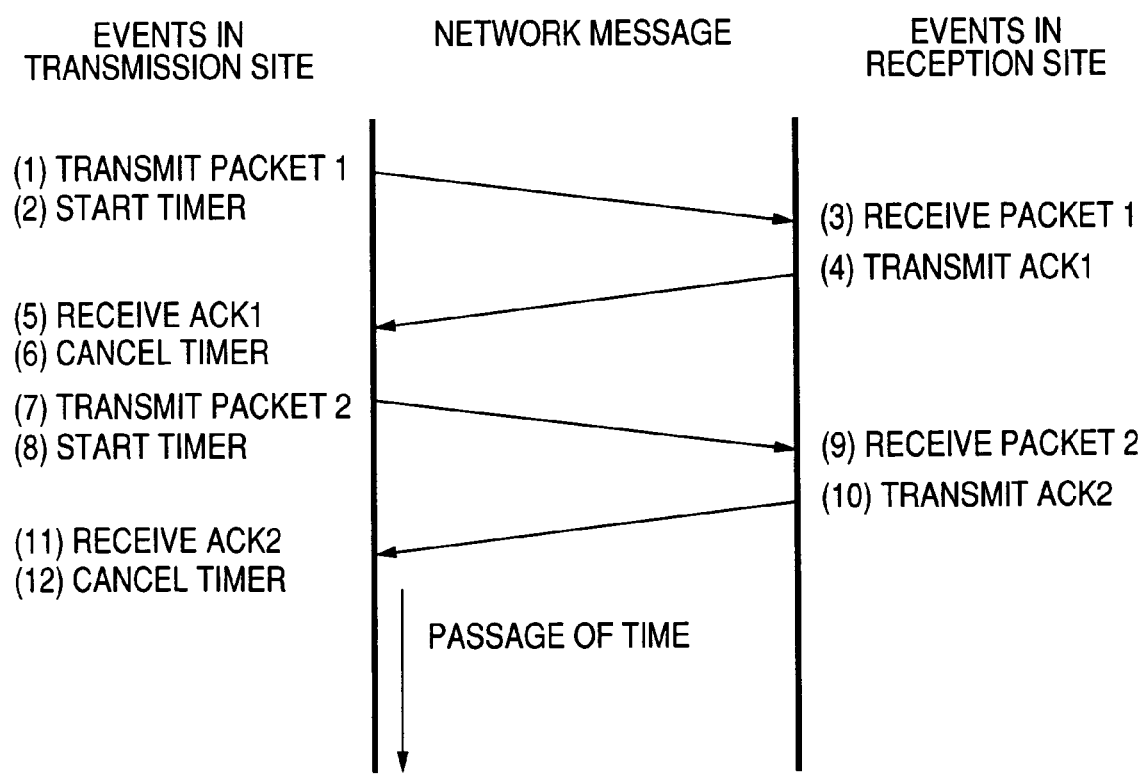
FIG. 7 is a schematic representation to describe the operation of positive acknowledgment in a communication system in a related art.
Figure 8:
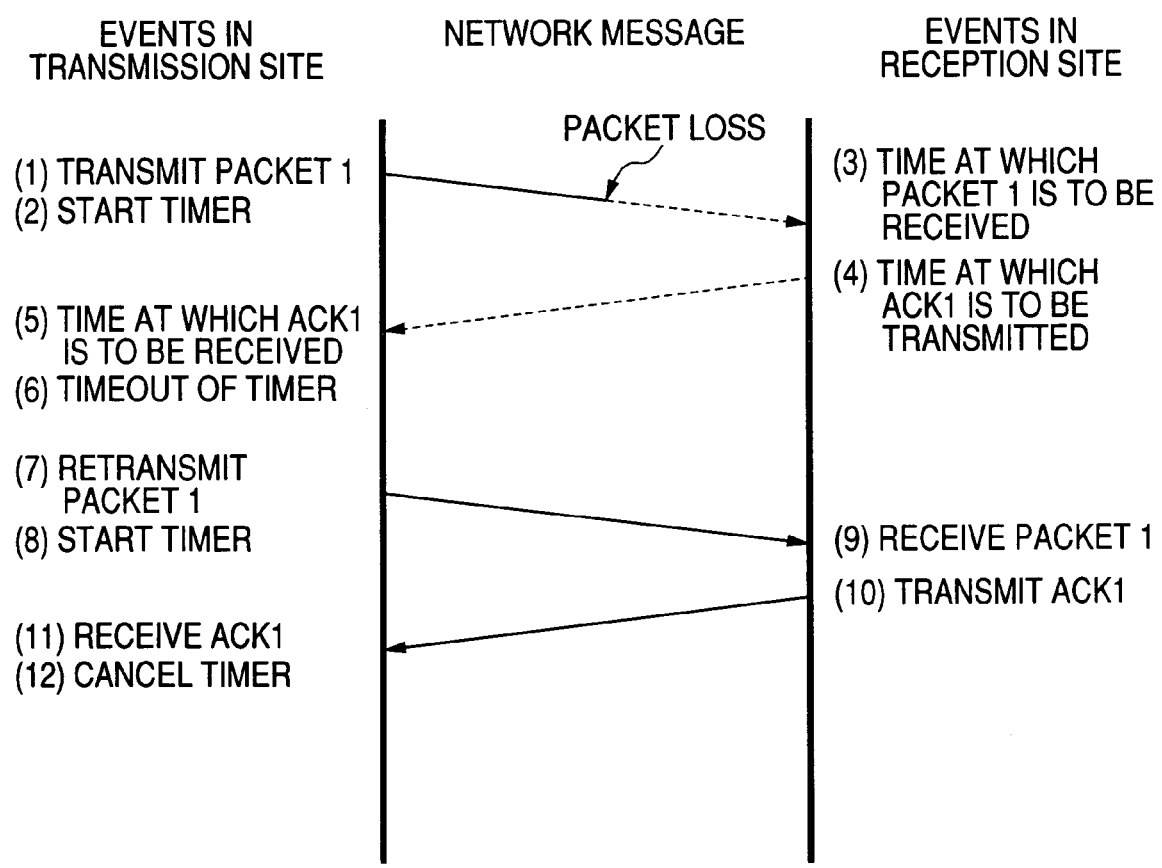
FIG. 8 is a schematic representation to describe the operation when a—packet loss occurs in a communication system similar to that in FIG. 7.

First, b11, . . . , b1k are compared and the value is found based on majority rule in the k data pieces. Every piece of information is 0 or 1 and thus the value can be easily found. This is performed for bij, i=1, . . . , n; j–1, . . . , k, and further is also performed for cij, i=1, . . . , l; j=1 . . . , m to find error correction vectors. FIG. 4 shows this state. The error correction vectors found using bij and cij are as follows:

Error correction vector found using bij;

$$b = Trans\ [b1, b2, \ldots, bn]$$

Error correction vector found using cij:

$$c = [c1, c2, \ldots, cn]$$

where Trans [A] is a transposed matrix of A.

Next, the information bits are decoded. First, decoding of a11' will be discussed, $$B1 = sum\ (a11' \ldots, alm')\ mod\ 2$$

is found. A comparison is made between B1 and b1 to check whether or not they equal. Next, $$C1 = sum\ (a11', \ldots, an1')\ mod\ 2$$

is found. A comparison is made between C1 and c1 to check whether or not they equal. To use the two types of b and c as the error correction vectors, the following four cases of the comparison result with the information bits are possible. For each case, information representing the correctness of a11' (probability of correctness) is called reliability information of a11'.

Case 1->B1=b1 and C1=c1
Case 2->B1=b1 and C1 NE c1
Case 3->B1 NE b1 and C1=c1
Case 4->B1 NE b1 and C1 NE c1

In Case 1, it is considered that the value of a11' is correct at the highest probability, namely, with a very high degree of reliability.

The correctness (degree of reliability) of a11' in Case 2 and Case 3 depends on the values of k and 1. If k=1, in Case 2 and Case 3, a11' is correct with the same degree of reliability. However, it is lower than the degree of reliability in Case 1. If k>1, the degree of reliability in Case 2 is higher than that in Case 3. However, it is lower than the degree of reliability in Case 1. If k<1, the degree of reliability in Case 3 is higher than that in Case 2. However, it is lower than the degree of reliability in Case 1.

In Case 4, the probability that the value of a11' may be correct becomes the lowest.

For example, the degree of reliability can be represented by the following expressions;

Case 1->degree of reliability=100[%]

Case 2>degree of reliability=100*(k/(k+1))[t]

Case 3->degree of reliability=100*(1/(k+1))[%]

Case 4->degree of reliability=0[%]

A threshold value is set for the degree of reliability and if the degree of reliability is lower than the setup threshold value, error correction is made (information of "1" or "0" is inverted). The threshold value may be set for each communication machine or may be changed dynamically. More than one threshold value may be set in information bits.

The information bit matrix may be prepared in a given unit range, for example, for each image frame rather than prepared for each packet.

In the embodiment, the information bits for the redundancy bits are found using column vector data and row vector data of the information bit matrix. However, for example, the information bits may be found by calculating in the slanting direction; for an image, etc., operations may be performed only on the portion corresponding to the center of the visual field; or the information bit matrix may be divided into small matrixes to find the information bits.

In the embodiment, the optical packet communications is applied, but is also effective for electrical communications.

As described above, according to the embodiment, the information bit length and the redundancy bit length can be set with high flexibility in combination. Further, the degree of reliability of information subjected to error correction can be set as desired in each combination. As a result, a high-reliability and economical communication system that can make the most of the communication band width can be provided even in a communication environment with large noise effect. In addition, the costs of service, maintenance, etc., in such a communication system can also be reduced.

Particularly, when the invention is applied to the optical packet communications, the high-level and stable communication quality can always be maintained.

What is claimed is:

1. A communication apparatus, comprising:
   an FEC encoder which adds information bits represented by an information bit matrix with n rows and m columns (n, m are natural numbers) to forward error correction code represented by an odd number of redundancy information bit rows and an odd number of redundancy information bit columns based on the information bit matrix, which are provided in the row direction and in the column direction of the information bit matrix respectively;
   a packet transmitting section which transmits packets including data in which the forward error correction code is added to the information bits;
   a packet receiving section which receives the packets; and
   an FEC decoder which performs error correction based on data included in the packets received by the packet receiving section,
   wherein the FEC decoder provides a variable degree of reliability for information subjected to error correction.

* * * * *